United States Patent [19]

Nishihara et al.

[11] Patent Number: 4,720,680

[45] Date of Patent: Jan. 19, 1988

[54] ADJUSTABLE RADIO FREQUENCY COIL FOR NUCLEAR MAGNETIC RESONANCE IMAGING

[75] Inventors: Susumu Nishihara; Kiyoshi Yoda, both of Amagasaki, Japan

[73] Assignee: Mitsubishi Denki Kabushiki Kaisha, Tokyo, Japan

[21] Appl. No.: 12,446

[22] Filed: Feb. 9, 1987

[30] Foreign Application Priority Data

| Feb. 18, 1986 [JP] | Japan | 61-31964 |
| Feb. 18, 1986 [JP] | Japan | 61-31966 |
| Aug. 26, 1986 [JP] | Japan | 61-200553 |
| Aug. 26, 1986 [JP] | Japan | 61-200554 |

[51] Int. Cl.$^4$ ............................................. G01R 33/20
[52] U.S. Cl. .................................... 324/322; 324/318; 333/219
[58] Field of Search ............ 324/300, 307, 309, 318, 324/320, 322; 333/219, 223, 235; 128/653; 336/178

[56] References Cited

U.S. PATENT DOCUMENTS

| 4,435,680 | 3/1984 | Froncisz | 324/318 |
| 4,563,648 | 1/1986 | Hill | 324/318 |
| 4,594,566 | 6/1986 | Maudsley | 324/318 |
| 4,620,155 | 10/1986 | Edelstein | 324/318 |
| 4,621,237 | 11/1986 | Timms | 324/322 |
| 4,634,980 | 1/1987 | Misic et al. | 324/322 |
| 4,641,098 | 2/1987 | Doty | 324/318 |

FOREIGN PATENT DOCUMENTS 0160942 11/1985 European Pat. Off.
6195234 5/1986 Japan.

Primary Examiner—Michael J. Tokar

[57] ABSTRACT

A radio frequency coil for a nuclear magnetic resonance imaging apparatus comprises a plurality of arcuate, plate-like H-shaped members which are disposed about a common axis so as to form a tube. The flanges of adjacent H-shaped members are electrically connected. The web of at least one of the H-shaped members is cut in two at its midportion to form two T-shaped plates, and the legs of the T-shaped plates are connected by capacitive coupling in a manner which allows the capacitance to be varied. A conventional variable capacitor can be used to vary the capacitance. Alternatively, each H-shaped member is divided into two T-shaped plates with overlapping legs. A dielectric material is provided between the overlapping portions, and the capacitance is varied by moving the T-shaped plates with respect to one another in the longitudinal direction of the tube so as to vary the size of the overlapping portions.

15 Claims, 16 Drawing Figures

ADJUSTABLE RADIO FREQUENCY COIL FOR NUCLEAR MAGNETIC RESONANCE IMAGING

BACKGROUND OF THE INVENTION

This invention relates to an adjustable radio frequency coil, and particularly to an adjustable radio frequency coil for use in a nuclear magnetic resonance imaging apparatus for medical diagnosis.

A radio frequency coil for nuclear magnetic resonance imaging is in effect a radio frequency antenna which is used to generate a radio frequency magnetic field for exciting the nuclei in a sample as well as to receive the radio frequency signals which are emitted by the excited nuclei. FIG. 1 illustrates a conventional radio frequency coil of the type described in the Journal of Magnetic Resonance, Volume 36, pages 447–451 (1979). This coil comprises a pair of plate-like H-shaped members 1 which are made of an electrically conducting material such as copper. The H-shaped members 1 are symmetrically disposed about a longitudinal axis so as to form a hollow cylinder. Each member 1 has a longitudinally-extending web 1a, which is referred to as a vertical band, and two laterally-extendings flanges 1b at opposite ends of the web 1a, the flanges 1b being referred to as wings. Adjacent flanges 1b are electrically connected with one another by means of chip capacitors 2. Two electrically conducting rings 3a and 3b are coaxially disposed within the cylinder at its opposite ends. The upper ring 3a is called a top guard ring, while the lower ring 3b is called a bottom guard ring. At least one of the two guard rings is grounded. The guard rings are separated from the inner surface of the H-shaped members 1 by a layer of an electrically-insulating material such as Teflon. The H-shaped members 1, the chip capacitors 2, and the guard rings 3a and 3b together constitute a microwave circuit which is equivalent to an LC series resonant circuit. The guard rings 3a and 3b shield a sample from the electric fields which are generated by the radio frequency voltage present between the wings and decrease dielectric losses within a sample.

The resonant frequency of the illustrated coil is dependent on the capacitance of the chip capacitors 2. However, as this coil employs fixed capacitors, the resonant frequency can be changed only by replacing the chip capacitors 2 for others with a different capacitance, making it difficult to adapt the coil to different needs and making it impossible to perform fine adjustments.

SUMMARY OF THE INVENTION

It is the object of the present invention to provide a radio frequency coil for nuclear magnetic resonance imaging whose resonant frequency can be continuously and easily varied.

A radio frequency coil for nuclear magnetic resonance imaging according to the present invention comprises one or more pairs of plate-like H-shaped members which are disposed around a common axis so as to form a tube. In a conventional radio frequency coil, each H-shaped member is made from a single plate, but in the present invention, at least one of the H-shaped members is divided in two at its midportion so as to form two T-shaped plates. The legs of the T-shaped plates are electrically connected by a variable capacitor means which enables the capacitance and thus the resonant frequency of the LC series resonant circuit formed by the tube to be continuously varied. In accordance with one form of the invention, the variable capacitor means comprises a conventional variable capacitor which is electrically connected between the legs of the T-shaped plates. In accordance with another form of the invention, each of the H-shaped members is divided at its midportion into two T-shaped plates, and the legs of the T-shaped plates overlap one another in the longitudinal direction of the tube. A dielectric material which constitutes the variable capacitor means is disposed between the legs of the T-shaped plates in the overlapping portions. By moving the T-shaped plates with respect to one another in the longitudinal direction, the size of the overlapping portions and thus the capacitance of the variable capacitor means can be continuously varied, thereby varying the resonant frequency of the tube.

BRIEF DESCRIPTION OF THE DRAWINGS

In the drawings, the same reference numerals indicate the same or corresponding parts.

DESCRIPTION OF THE PREFERRED EMBODIMENTS

Figure 1:
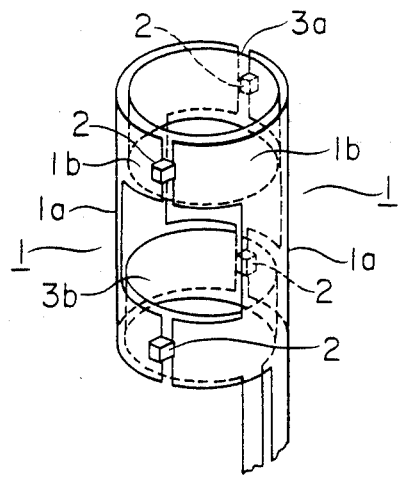
FIG. 1 is a schematic perspective view of a conventional radio frequency coil for nuclear magnetic resonance.

Hereinbelow, a number of preferred embodiments of the present invention will be described while referring to the accompanying drawings, FIG. 2 of which is a schematic perspective view of a first embodiment. Similar to the conventional radio frequency coil shown in FIG. 1, the present embodiment has a pair of arcuate, plate-like H-shaped members 4 which are symmetrically disposed about a common longitudinal axis so as to form a cylindrical tube. The H-shaped members 4 are made of an electrically conducting material such as copper plates. Each of the H-shaped members has a longitudinally-extending web 4a (corresponding to the vertical bands 1a of FIG. 1) and two flanges 4b (corresponding to the wings 1b) at its opposite ends which are perpendicular to the webs 4a and extend circumferentially around the tube. The upper flanges 4b of the two H-shaped members 4 are electrically connected to one another by fixed capacitors in the form of chip capacitors 5, and in a similar manner the bottom flanges 4b are electrically connected together. A top guard ring 6a and a bottom guard ring 6b, both made of an electrically conducting material, are concentrically disposed inside the tube at opposite ends thereof. The guard rings are separated from the inner surface of the H-shaped members 4 by an unillustrated layer of an electrically insulating material.

In contrast to the conventional apparatus of FIG. 1, in the present invention at least one of the H-shaped members 4 is cut transversely in two at the midportion of its web 4a so as to form two T-shaped plates 7a and 7b. The legs of the T-shaped plates, which correspond to the two halves of the web 4a of the H-shaped member 4, are connected by capacitive coupling using a variable capacitor means. In the present embodiment, the variable capacitor means comprises a conventional variable capacitor 8 which is electrically connected to the legs of the two T-shaped plates 7a and 7b.

Figure 3:
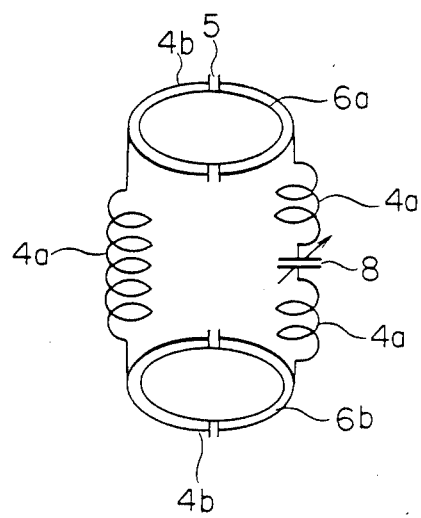
FIG. 3 is an equivalent circuit diagram of the embodiment of FIG. 2.

The H-shaped members 4, the chip capacitors 5, the guard rings 6a and 6b, and the variable capacitor 8 together form a microwave circuit. As shown in FIG. 3, which is an equivalent circuit diagram, the microwave circuit is equivalent to an LC series resonant circuit, the resonant frequency of which can be continuously varied by adjusting the variable capacitor 8. Accordingly, the resonant frequency of a radio frequency coil according to the present invention can be easily and continuously varied by means of the variable capacitor 8.

Figure 2:
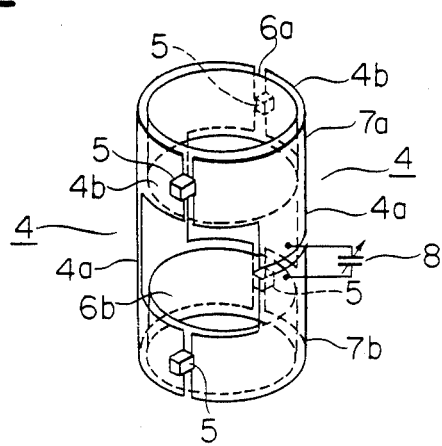
FIG. 2 is a schematic perspective view of a first embodiment of a radio frequency coil according to the present invention.
Figure 4:
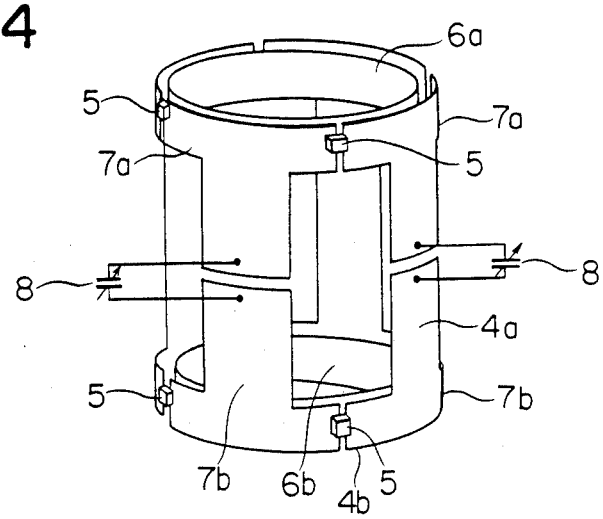
FIG. 4 is a schematic perspective view of a second embodiment of the present invention employing four H-shaped members.

In the embodiment of FIG. 2, a single pair of H-shaped members 4 is employed, but it is possible to use a larger number. FIG. 4 illustrates a second embodiment of the present invention which employs two pairs of H-shaped members 4 which are symmetrically disposed about a common axis. At least one H-shaped member 4 of each pair is transversely divided at its midportion into two T-shaped plates 7a and 7b which are electrically connected by variable capacitors 8. By adjusting the variable capacitors 8, the resonant frequency of the equivalent LC series resonant circuit can be continuously adjusted in the same manner as the embodiment of FIG. 2.

Figure 5:
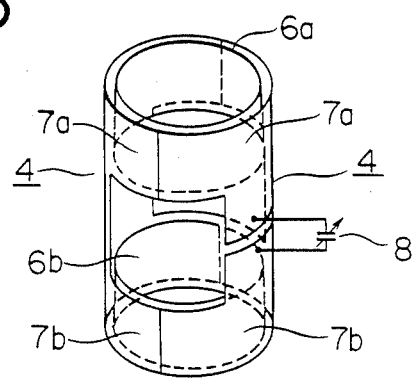
FIG. 5 is a schematic perspective view of a third embodiment of the present invention in which the flanges of the H-shaped members are secured directly to one another.

In the previous two embodiments, the flanges 4b of adjacent H-shaped members 4 are physically separated from one another, and are electrically connected by capacitive coupling using chip capacitors 5. However, as shown in FIG. 5, which illustrates a third embodiment of the present invention, it is possible for the flanges 4b to be secured directly to one another in a manner such that there is good electrical contact therebetween. For example, the flanges 4b can be connected by pressure welding or by soldering. Alternatively, they can be electrically connected with one another by electrically conducting wires or other type of conductor.

Figure 6:
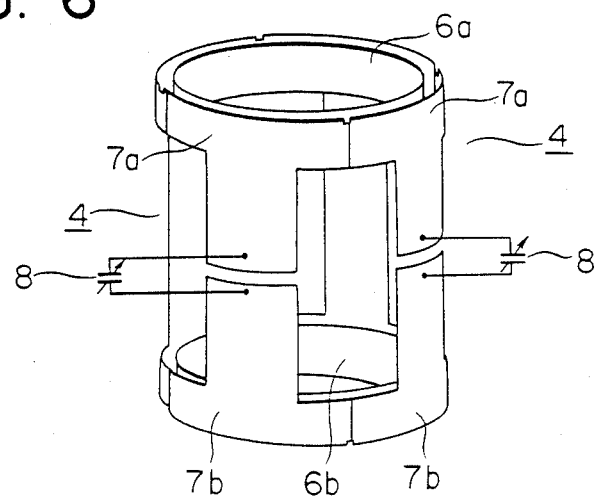
FIG. 6 is a schematic perspective view of a fourth embodiment of the present invention employing a plurality of variable capacitors.

FIG. 6 illustrates a fourth embodiment of the present invention which is similar to the embodiment of FIG. 5, except that like the embodiment of FIG. 4, it has two pairs of H-shaped members 4. At least one member of each pair is divided into two T-shaped plates 7a and 7b which are electrically connected with one another by variable capacitors 8.

Figure 7:
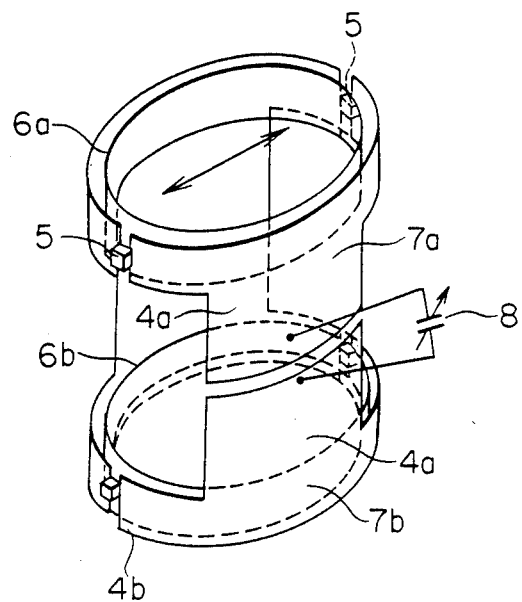
FIG. 7 is a schematic perspective view of a fifth embodiment of the present invention in which the tube formed by the H-shaped members has an elliptical transverse cross section.
Figure 8:
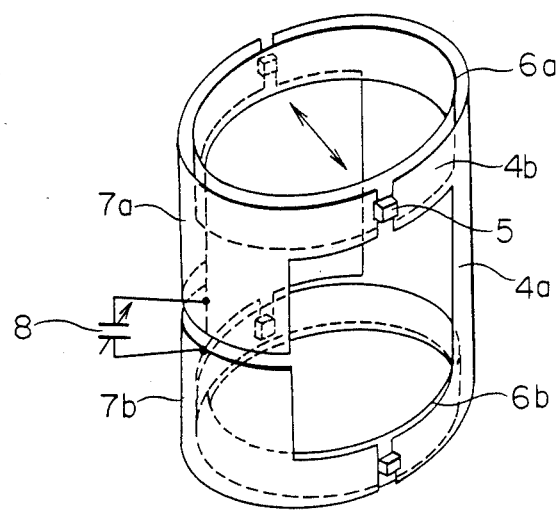
FIG. 8 is a schematic perspective view of a sixth embodiment of the present invention in which the webs of the H-shaped members are disposed at opposite ends of the major axes of the elliptical cross sections of the tube.

When a radio frequency coil is used in a whole body NMR imaging apparatus, due to the large dimensions of the tube (which must be large enough to surround any part of the human body), the efficiency of magnetic field generation and the signal-to-noise ratio of input signals decrease. It is possible to compensate for these decreases by designing the tube formed by the H-shaped members such that it has an elliptical transverse cross section, which results in a higher magnetic field generating efficiency and S/N ratio. FIG. 7 and FIG. 8 illustrate a fifth and a sixth embodiment, respectively, of the present embodiment which are designed to surround any transverse cross section of the human body. The H-shaped members 4 are curved so as to form a tube with an elliptical transverse cross section. The embodiment of FIG. 7 employs two H-shaped members 4 whose webs 4a are disposed at opposite ends of the minor axes of transverse cross sections of the tube. The arrows in FIG. 7 and FIG. 8 indicate the directions of the magnetic field which is produced by the tube. If the tube is disposed so that its longitudinal axis and the major axes of the transverse cross sections are horizontal, the direction of the magnetic field generated within the tube will horizontal. In contrast, in the embodiment of FIG. 8, the webs 4a of the H-shaped members 4 are disposed at opposite ends of the major axes of the transverse cross sections of the tube, so that the direction of the magnetic field will be vertical when the tube is placed so that its longitudinal axis and the major axes of the transverse cross sections are horizontal. The operation of these two embodiments is identical to that of the embodiment of FIG. 2. The efficiency of magnetic field generation and the signal-to-noise ratio of such an elliptical tube are significantly higher than for one with a circular transverse cross section. It has been experimentally determined that for a resonant frequency of 64 MHz, with the same electrical power consumption, the magnetic field strength is 60–70% higher for a tube with an elliptical transverse cross section than for one with a circular transverse cross section.

In the previous embodiments of a radio frequency coil according to the present invention, only one of the H-shaped members 4 in each pair is divided into two T-shaped plates. However, if the other H-shaped member in each pair is also divided into two T-shaped plates and another variable capacitor is connected between the two T-shaped plates, the frequency range of the radio frequency coil can be increased.

Figure 9:
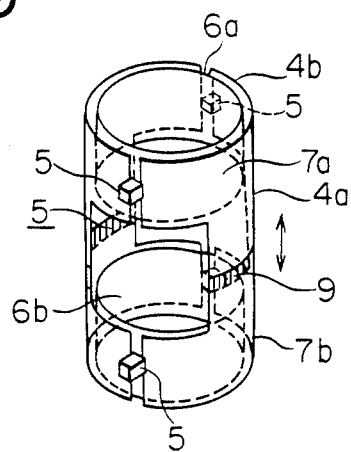
FIG. 9 is a schematic perspective view of a seventh embodiment of the present invention which employs a different form of variable capacitor means.
Figure 10:
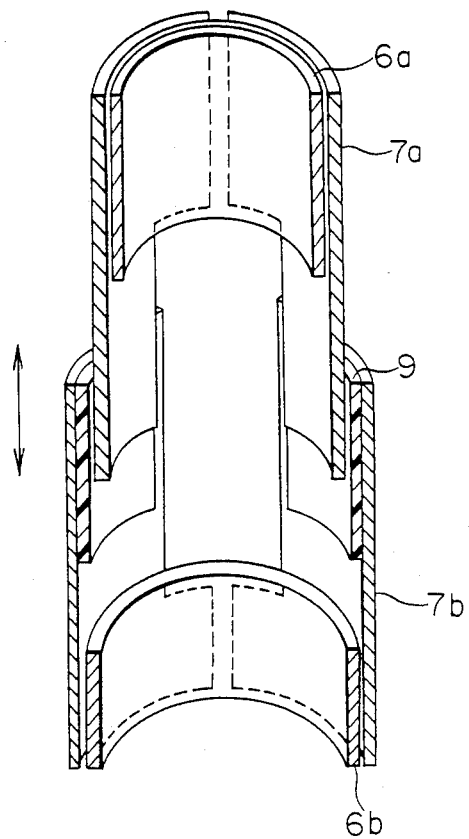
FIG. 10 is a vertical cross sectional view of the embodiment of FIG. 9.
Figure 11:
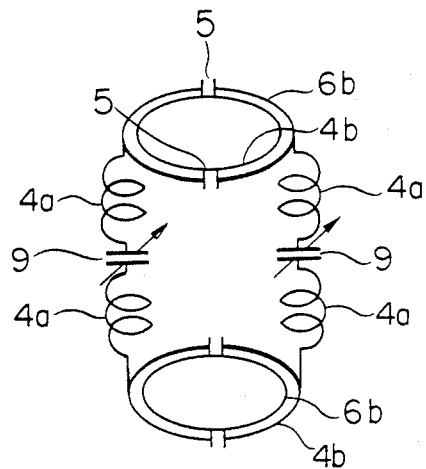
FIG. 11 is an equivalent circuit diagram of the embodiment of FIG. 9.

In each of the previous embodiments, the variable capacitor means by which the T-shaped plates 7a and 7b are electrically connected is a conventional variable capacitor 8. FIG. 9 illustrates a seventh embodiment of the present invention in which the variable capacitor means has a different form. Like the embodiment of FIG. 2, this embodiment comprises two H-shaped members 4 whose flanges 4b are connected to one another by chip capacitors 5, and a pair of electrically conducting guard rings 6a and 6b which are concentrically disposed inside the cylindrical tube formed by the H-shaped members 4 and which are electrically insulated from the inner surface of the H-shaped members 4 by an unillustrated insulating layer. However, in this embodiment, both of the H-shaped members 4 are transversely divided at the midportion of their webs 4a so as to form two T-shaped plates 7a and 7b. As shown in FIG. 10, which is a vertical cross-sectional view of the embodiment of FIG. 9, the legs of the T-shaped plates 7a and 7b of each H-shaped member 4 overlap one another in the longitudinal direction of the tube. The T-shaped plates 7a and 7b are supported by suitable means such that the height of the overlapping portions can be varied by moving the T-shaped plates with respect to one another in the longitudinal direction of the tube. It is possible for the upper T-shaped plates 7a to be held stationary while the lower T-shaped plates 7b are moved as a single unit or vice versa, or it is possible to move both the upper and lower T-shaped plates 7a and 7b. A dielectric material 9 having the shape of an arcuate strip is disposed between the overlapping portions, the length of the dielectric material 9 being substantially equal to the width of the legs of the T-shaped plates. In this embodiment, as shown in FIG. 10, the dielectric material 9 is secured to the inner surface of the lower T-shaped plate 7b, but alternatively, it can be secured to the outer surface of the upper T-shaped plate 7a. A suitable material for the dielectric material 9 is porcelain or a synthetic resin such as polytetrafluoroethylene. The overlapping portions of the T-shaped plates 7a and 7b and the dielectric material 9 together constitute variable capacitor means. The capacitance of this variable capacitor means can be varied by moving the T-shaped plates 7a and 7b with respect to one another in the axial direction of the tube so as to vary the height and thus the area of the overlapping portions. By thus varying the capacitance, the resonant frequency of the equivalent LC series resonant circuit formed by the H-shaped members 4, the chip capacitors 5, the guard rings 6a and 6b, and the variable capacitor means can be continuously varied. FIG. 11 is an equivalent circuit diagram of this embodiment.

Figure 12:
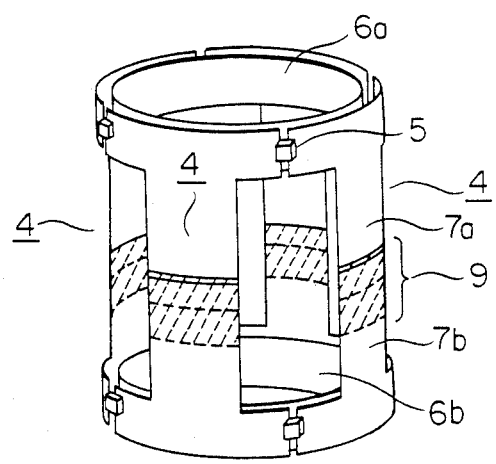
FIG. 12 is a schematic perspective view of an eighth embodiment of the present invention having four H-shaped members.

The embodiment of FIG. 9 employs only a single pair of H-shaped members 4, but as shown in FIG. 12, which is a schematic perspective view of an eighth embodiment, it is possible to employ a plurality of pairs of H-shaped members 4. Each of the H-shaped members 4 is divided in two at the midportion of its web 4a so as to form two T-shaped plates 7a and 7b having overlapping legs, and a dielectric material 9 is disposed between the legs in the overlapping portion. The operation of this embodiment is the same as that of the embodiment of FIG. 9.

Figure 13:
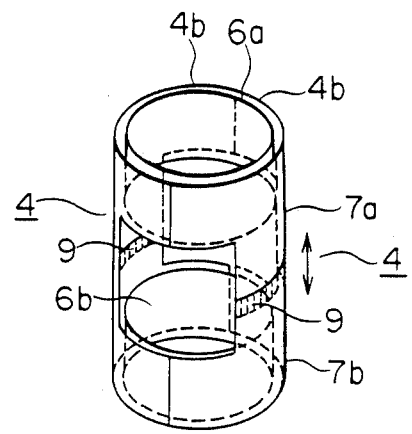
FIG. 13 is a schematic perspective view of a ninth embodiment of the present invention in which the flanges of adjacent H-shaped members are directly secured to one another.
Figure 14:
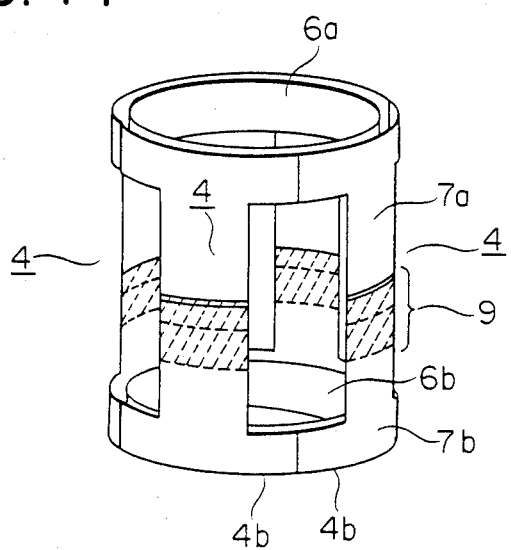
FIG. 14 is a schematic perspective view of a tenth embodiment of the present invention in which the flanges of four H-shaped members are secured to one another.

As is the case with the embodiment of FIG. 5, the flanges 4b of adjacent H-shaped members 4 may be directly connected to one another instead of being linked by capacitive coupling. FIG. 13 shows a ninth embodiment of the present invention having two H-shaped members 4 whose flanges 4b are directly connected with one another by pressure welding or by soldering, while FIG. 14 shows a tenth embodiment having four symmetrically disposed H-shaped members 4 whose flanges 4b are similarly connected. It is also possible to connect adjacent flanges 4b using electrically conducting wires or other electrical conductors. The operation of these embodiments is identical to that of the embodiment of FIG. 9.

Figure 15:
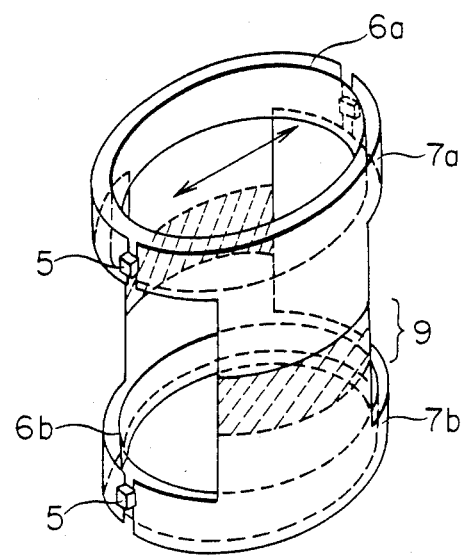
FIG. 15 is a schematic perspective view of an eleventh embodiment of the present invention in which the tube has an elliptical transverse cross section.
Figure 16:
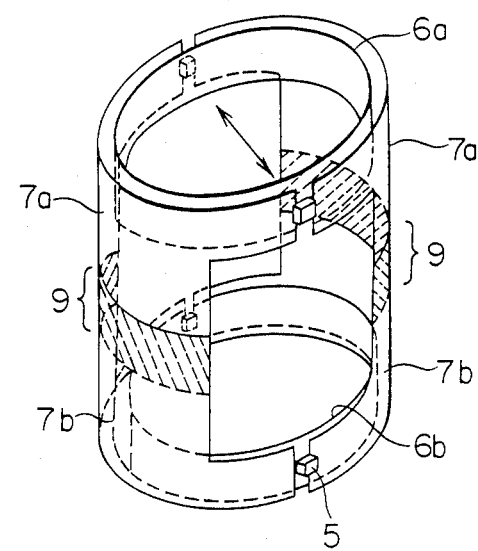
FIG. 16 is a schematic perspective view of a twelfth embodiment of the present invention in which the webs of the H-shaped members are disposed at opposite ends of the major axes of the elliptical cross sections of the tube.

FIG. 15 and FIG. 16 show an eleventh and a twelfth embodiment, respectively, of the present invention in which the transverse cross-sectional shape of the tube formed by the H-shaped members 4 is elliptical. In the embodiment of FIG. 15, the webs 4a of the H-shaped members 4 are disposed at opposite ends of the minor axes of the transverse cross sections of the tube, while in the embodiment of FIG. 16, the webs 4a of the H-shaped members are disposed at opposite ends of the major axes of the transverse cross sections. The directions of the magnetic fields produced in each case are indicated by the arrows in the drawings. The operation of these embodiments is identical to that of the embodiment of FIG. 9. Like the elliptical embodiments of FIGS. 7 and 8, they have the advantage that the efficiency of magnetic field generation and the signal-to-noise ratio of input signals are increased compared with a radio frequency coil coil having a cylindrical shape, making them suitable for a large-sized, whole body NMR imaging apparatus.

It is desirable to surround the tube formed by the H-shaped members 4 with an electromagnetic shield in the form of an electrically conducting cylinder which is concentric with respect to the tube. Such an electromagnetic shield decreases losses of the LC series resonant circuit and increases the spatial uniformity of the high frequency magnetic field which is generated within the tube.

In all of the previous embodiments, electrically conducting guard rings 6a and 6b is disposed inside the tube formed by the H-shaped members 4, but these rings are not necessary for the LC series resonant circuit to resonate and can be dispensed with.

What is claimed is:

1. A radio frequency coil for a nuclear magnetic resonance imaging apparatus comprising:
    one or more pairs of plate-like H-shaped electrically conducting members, each of said H-shaped members having a longitudinally-extending web and two flange portions at opposite ends of and perpendicular to said web, each of said H-shaped members being bent into the shape of an arc and being symmetriclaly disposed about a common axis so as to form a tube, each of said webs being parallel to said axis and each of said flanges extending circumferentially around said tube towards one another, each flange being electrically connected to a flange of the adjacent H-shaped member, at least one of the H-shaped members of each pair being transversely divided in two at the midportion of its web so as to form two T-shaped plates; and
    variable capacitor means having a variable capacitance for electrically connecting the legs of said two T-shaped plates by capacitive coupling.

2. A radio frequency coil as claimed in claim 1, wherein said variable capacitor means comprises a variable capacitor.

3. A radio frequency coil as claimed in claim 1, wherein:
each of said H-shaped members is divided transversely in two at the midportion of its web to form two T-shaped plates;
the legs of the two T-shaped plates of each H-shaped member overlap in the longitudinal direction of the tube;
said T-shaped plates are supported such that at least one of the two T-shaped plates of each H-shaped member can be moved with respect to the other T-shaped plate in the longitudinal direction of said tube so as to vary the area of the overlapping portion; and
said adjustable capacitor means comprises the overlapping portions of the legs of said T-shaped plates, and a dielectric material which is disposed between the overlapping legs of the two T-shaped plates of each H-shaped member, said dielectric material being secured to the leg of only one of the two T-shaped plates of each H-shaped member.

4. A radio frequency coil as claimed in claim 3, wherein said dielectric material is selected from the group consisting of synthetic resins and porcelain.

5. A radio frequency coil as claimed in claim 1, wherein the flanges of adjacent H-shaped members are connected by pressure welding.

6. A radio frequency coil as claimed in claim 1, wherein the flanges of adjacent H-shaped members are connected by soldering.

7. A radio frequency coil as claimed in claim 1, wherein the flanges of adjacent H-shaped members are connected by electrical conductors.

8. A radio frequency coil as claimed in claim 1, wherein the flanges of adjacent H-shaped members are connected by capacitive coupling.

9. A radio frequency coil as claimed in claim 8, wherein the flanges of adjacent H-shaped members are connected by fixed capacitors.

10. A radio frequency coil as claimed in claim 1, wherein the transverse cross-sectional shape of said tube is circular.

11. A radio frequency coil as claimed in claim 1, wherein the transverse cross-sectional shape of said tube is elliptical.

12. A radio frequency coil as claimed in claim 11, wherein said tube comprises one pair of said H-shaped members which are disposed with their webs at opposite ends of the major axes of the transverse cross sections of said tube.

13. A radio frequency coil as claimed in claim 11, wherein said tube comprises one pair of said H-shaped members which are disposed with their webs at opposite ends of the minor axes of the transverse cross sections of said tube.

14. A radio frequency coil as claimed in claim 1, further comprising an electromagnetic shield which surrounds said H-shaped members and is coaxial with respect to said tube.

15. A radio frequency coil as claimed in claim 1, further comprising two electrically conducting rings which are coaxially disposed in said tube at opposite ends thereof within said flanges, said rings being electrically insulated from said tube, at least one of said rings being grounded.

* * * * *